(12) United States Patent
Lew et al.

(10) Patent No.: US 7,480,581 B2
(45) Date of Patent: Jan. 20, 2009

(54) CALIBRATING A TESTING DEVICE

(75) Inventors: Edward Roger Lew, Los Angeles, CA (US); Xiaoqing Liu, Thousand Oaks, CA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/475,581

(22) Filed: Jun. 27, 2006

(65) Prior Publication Data

US 2007/0299621 A1    Dec. 27, 2007

(51) Int. Cl.
  *G06F 19/00*    (2006.01)
(52) U.S. Cl. .................................... 702/107
(58) Field of Classification Search ............... 702/107, 702/117; 324/601
  See application file for complete search history.

(56) References Cited

U.S. PATENT DOCUMENTS

| 6,609,077 | B1 | 8/2003 | Brown et al. | |
| 7,120,840 | B1* | 10/2006 | Shimanouchi | 714/700 |
| 2006/0067390 | A1* | 3/2006 | Tek et al. | 375/224 |

OTHER PUBLICATIONS http://www.merriam-webster.com/dictionary/Synthesizer, p. 1.*
M. Shimanouchi, Periodic Jitter Injection with Direct Time Synthesis by SSP™ ATE for SerDes Jitter Tolerance Test in Production, ITC Proceedings pp. 48-57, 2003.
Y.Cai, S.A. Werner, G.J. Zhang, M.J. Olsen, R.D. Brink, Jitter Testing for Multi-Gigabit Backplane SerDes, ITC Proceedings, pp. 700-709, 2002.
J. Patrin, M. Li, Comparison and Correlation of Signal Integrity Measurement Techniques, DesignCon, 2002.
Agileni Technologies, Inc., Jitter Separation-50 Mb/s to Over 40 Gb/s Using the Agilent 86100C Infiniium DCA-J, 2003.
International Seach Report & Written Opinion in Application No. PCT/US06/25992, dated Jun. 6, 2008.
Agilent 86100C Infiniium DCA-J datasheet [online]. Agilent Technologies, (c) 2007 [retrieved on Jun. 25, 2008]. Retrieved from the Internet: <URL: http://cp.literature.agilent.com/litweb/pdf/5989-0278EN.pdf>.
Digital Sampling Oscilloscope TDS8000 product specifications [online]. Tektronix, Inc. 1999-2001 [retrieved on Jun. 25, 2008]. Retrieved from the Internet: <URL:http://www.tek.com/Measurement/Products/catalog/tds800_sd/specs.html>.
Technical Note, OC-192 Jitter Measurement, MP1570A Sonet/SDH/PDH/ATM Analyzer, MP1580A Portable 2.5G/10G Analyzer, Anritsu Corporation, (2002), pp. 1-23.
Wavecrest Press Release, "Wavecrest Announces Successful Demonstration of the SIA-3000 on Advantest's T2000 Semiconductor Test System", dated Jul. 14, 2004 (2 pgs.).
Wavecrest SIA-3000 product information [online]. Wavecrest, 2004 [retrieved on Jun. 25, 2008]. Retrieved from the Internet: <URL:http://www.wavecrest.com/products/SIA-3000htm>.

* cited by examiner

*Primary Examiner*—Tung S Lau
(74) *Attorney, Agent, or Firm*—Fish & Richardson P.C.

(57) ABSTRACT

Calibrating automatic test equipment (ATE) includes adding jitter to a test signal to produce a jittered signal, sampling the jittered signal to produce digital values, generating a reconstructed jittered signal from the digital values, determining an amount of jitter in the reconstructed jittered signal, and calibrating the ATE based on the amount of jitter in the reconstructed jittered signal.

25 Claims, 9 Drawing Sheets

CALIBRATING A TESTING DEVICE

TECHNICAL FIELD

This patent application relates generally to calibrating a testing device, such as a tester used in automatic test equipment (ATE).

BACKGROUND

Automatic test equipment (ATE) refers to an automated, usually computer-driven, system for testing devices, such as semiconductors, electronic circuits, and printed circuit board assemblies. A device tested by ATE is referred to as a device under test (DUT).

ATE typically includes a computer system and a testing device or a single device having corresponding functionality. Pin electronics are typically part of the testing device. Pin electronics includes drivers, comparators and/or active load functionality for testing a DUT. The drivers provide test signals to pins on the testing device.

ATE is capable of providing different types of signals to a DUT. Among these signals are the test signals noted above, which are used during testing of the DUT (e.g., to test the DUT). One test that may be performed by the ATE on a DUT relates to jitter tolerance. In particular, the ATE determines how much jitter a DUT can tolerate before failing. To perform this test, jitter is inserted into ATE test signals, which are then provided to the DUT. The ATE receives measurements back from the DUT, which may be used to determine how the DUT reacted to the jitter. For example, if a measurement is within a predicted range or tolerance, the DUT is operating properly in the presence of the jitter. If the measurement is outside the predicted range or tolerance, the DUT is not operating properly in the presence of the jitter.

The ATE may be programmed, during manufacture, with data that is used to add a predefined amount of jitter to a test signal. A user of the ATE may select an amount of jitter to add to a signal, and the ATE retrieves the appropriate data, and generates a test signal that includes the selected amount of jitter. To address inherent inaccuracies in its circuitry, the ATE is typically calibrated prior to programming. That is, output jitter of the ATE is determined as a function of input jitter. The relationship between the two is used to determine the data that is programmed into the ATE.

SUMMARY

This patent application describes methods and apparatus, including computer program products, for calibrating a testing device that may be included in ATE.

In general, this application is directed to calibrating ATE by, e.g., adding jitter to a test signal to produce a jittered signal, sampling the jittered signal to produce digital values, generating a reconstructed jittered signal from the digital values, determining an amount of jitter in the reconstructed jittered signal, and calibrating the ATE based on the amount of jitter in the reconstructed jittered signal. This calibration process may also include one or more of the following features.

The jitter may be sampled using a walking strobe clock. The walking strobe clock may have a frequency that is different from a frequency of the jittered signal. Determining the amount of jitter in the reconstructed signal may include obtaining a difference between a maximum edge time and minimum edge time in the reconstructed jittered signal. Adding jitter to the test signal may include generating a periodic waveform, changing an amplitude of the periodic waveform to produce an altered waveform, controlling a phase shifter using the altered waveform, applying a clock signal to the phase shifter to produce a phase-shifted signal, and using the phase-shifted signal to generate the jittered signal. The phase shifter may shift a phase of the clock signal by an amount that corresponds to an amplitude of the altered waveform.

The calibration process may use a clock generator to apply the clock signal and may use an output of a digital-to-analog controller (DAC) to change the amplitude of the periodic waveform. The calibration process may also include obtaining an amount of jitter in reconstructed signals for combinations of a DAC input value, clock generator frequency, and jitter frequency. Calibration may be based, at least in part, on resulting measurements of the amount of jitter in the reconstructed signals for the combinations. Calibration may include using at least one of interpolation, extrapolation, and curve fitting of obtained amounts of jitter, and may also include storing, on the ATE, data corresponding to obtained amounts of jitter for the combinations of DAC input value, clock generator frequency, and jitter frequency. The data may be usable to obtain a specified amount of jitter during testing of a device using the ATE.

In general, this application is also directed to ATE that includes circuitry to add jitter to a test signal to produce a jittered signal. This circuitry may include a clock generator to produce a clock signal, a comparator to sample the jittered signal in accordance with the clock signal, and, as a result of sampling, to output digital values, and one or more processing devices to generate a reconstructed jittered signal from the digital values, to determine an amount of jitter in the reconstructed jittered signal, and to calibrate the ATE based on the amount of jitter in the reconstructed jittered signal. This circuitry and/or the ATE may also include one or more of the following features.

The clock generator may be configured to generate a walking strobe clock. The walking strobe clock may have a frequency that is different from (e.g., less than) a frequency of the jittered signal. Determining the amount of jitter in the reconstructed signal may include obtaining a difference between a maximum edge time and a minimum edge time in the reconstructed jittered signal. The circuitry may include a direct digital synthesizer to generate a periodic waveform, a digital-to-analog controller (DAC) to provide data for controlling an amplitude of the periodic waveform, a variable gain amplifier to control the amplitude of the periodic waveform in accordance with the data to produce an altered waveform, a phase shifter that is controllable using the altered waveform, a signal generator to apply a clock signal to the phase shifter to produce a phase-shifted signal, and an edge generator to produce the jittered signal based on the phase-shifted signal. The phase shifter may be configured to shift a phase of the clock signal by an amount that corresponds to an amplitude of the altered waveform.

Calibrating the ATE may include obtaining an amount of jitter in the reconstructed jittered signal for different combinations of a DAC input value, signal generator frequency, and jitter frequency. The one or more processing devices may be configured to determine the DAC input value and using at least one of interpolation, extrapolation, and curve fitting to obtain jitter amounts from reconstructed jittered signals. The circuitry may also include memory to store data corresponding to an amount of jitter added to the test signal. The data may be usable to obtain a requested amount of jitter during testing of a device using the ATE.

In general, this application is also directed to one or more machine-readable media containing instructions that are executable by one or more processing devices to calibrate ATE. The instructions may cause the one or more processing devices to generate a reconstructed jittered signal from digital values that were sampled from a jittered signal using a clock signal, where the jittered signal comprises a test signal to which an amount of jitter has been added, determine an amount of jitter in the reconstructed jittered signal, and calibrate the ATE based on the amount of jitter in the reconstructed jittered signal. This aspect may also include one or more of the following features.

The jitter may be sampled using a walking strobe clock. The walking strobe clock may have a frequency that is different from (e.g., less than) a frequency of the jittered signal. The one or more machine-readable media may include instructions to store, on the ATE, data corresponding to an amount of jitter added to the test signal. The data may be usable to obtain a predefined amount of jitter during testing of a device using the ATE. Calibrating the ATE may include calibrating the ATE for one or more different combinations of conditions that produce jitter (for example, but not limited to, a DAC input value, clock generator frequency, and jitter frequency). Determining the amount of jitter in the reconstructed signal may include obtaining a difference between a maximum edge time and a minimum edge time in the reconstructed jittered signal.

In general, this application is also directed to circuitry that may include a phase shifter to add jitter to a test signal to produce a jittered signal, a circuit to sample the jittered signal using a walking strobe clock to thereby produce digital values, and one or more processing devices to store, in memory on a testing device, data indicative of an amount of jitter to be added to an output signal to produce a desired amount of jitter in the output signal, wherein the data is based on the digital values. A clock generator may be used to generate the walking strobe clock. The walking strobe clock may have a frequency that is different from a frequency of the jittered signal.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
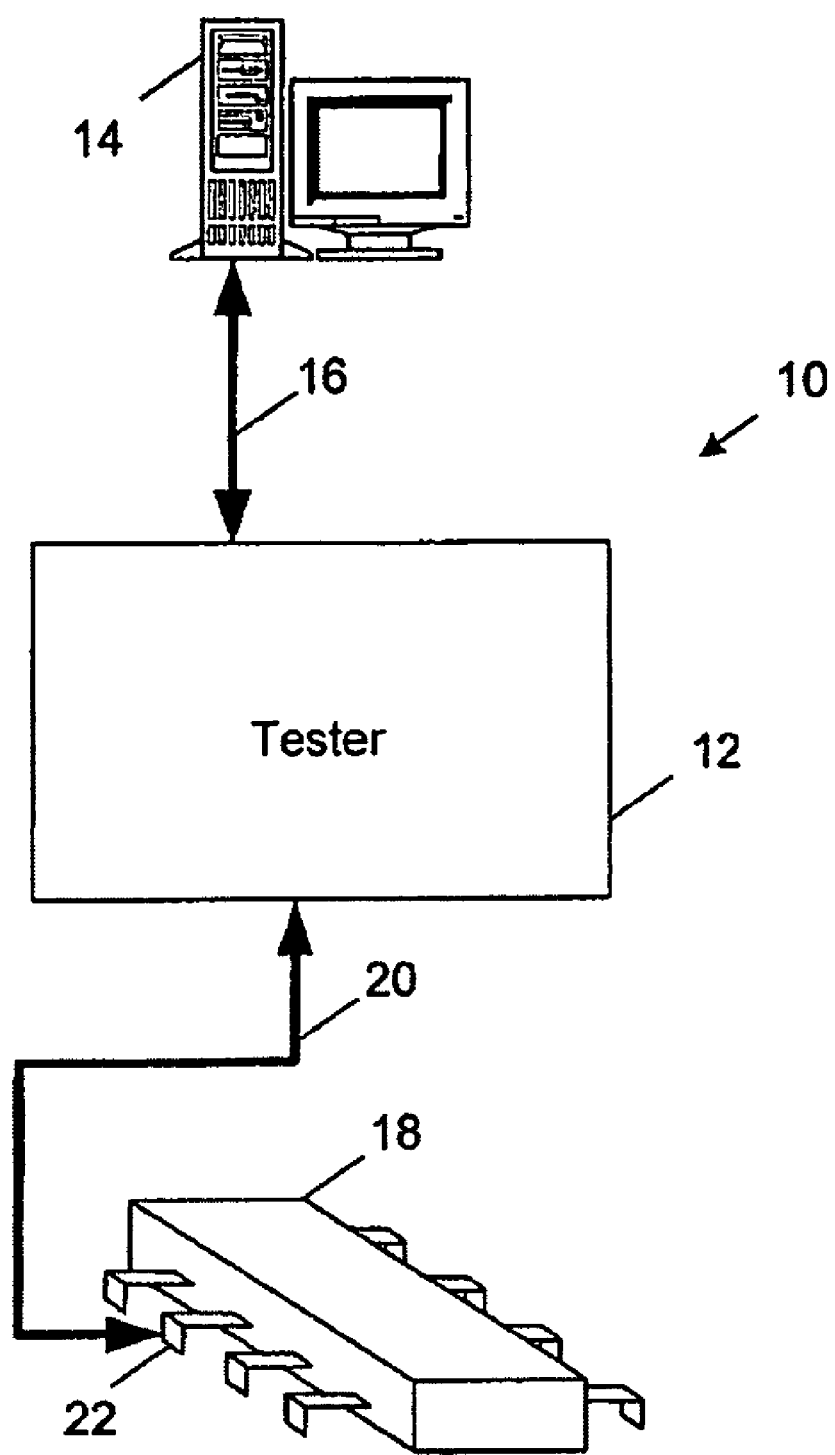
FIG. 1 is a block diagram of ATE for testing devices.

Referring to FIG. 1, a system 10 for testing a device-under-test (DUT) 18, such as a semiconductor device, includes a tester 12, such as automatic test equipment (ATE) or other similar testing device. To control tester 12, system 10 includes a computer system 14 that interfaces with tester 12 over a hardwire connection 16. Typically, computer system 14 sends commands to tester 12 that initiate the execution of routines and functions for testing DUT 18. Such executing test routines may initiate the generation and transmission of test signals to the DUT 18 and collect responses from the DUT. Various types of DUTs may be tested by system 10. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals (e.g., PMU test signals, PE test signals, etc.) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12. For example, a test signal may be injected over conductor 20 into pin 22 and a response signal may be collected from one or more other pins of DUT 18. This response signal is provided to semiconductor device tester 12 to determine quantities, such as gain response, phase response, and other throughput measurement quantities.

Figure 2:
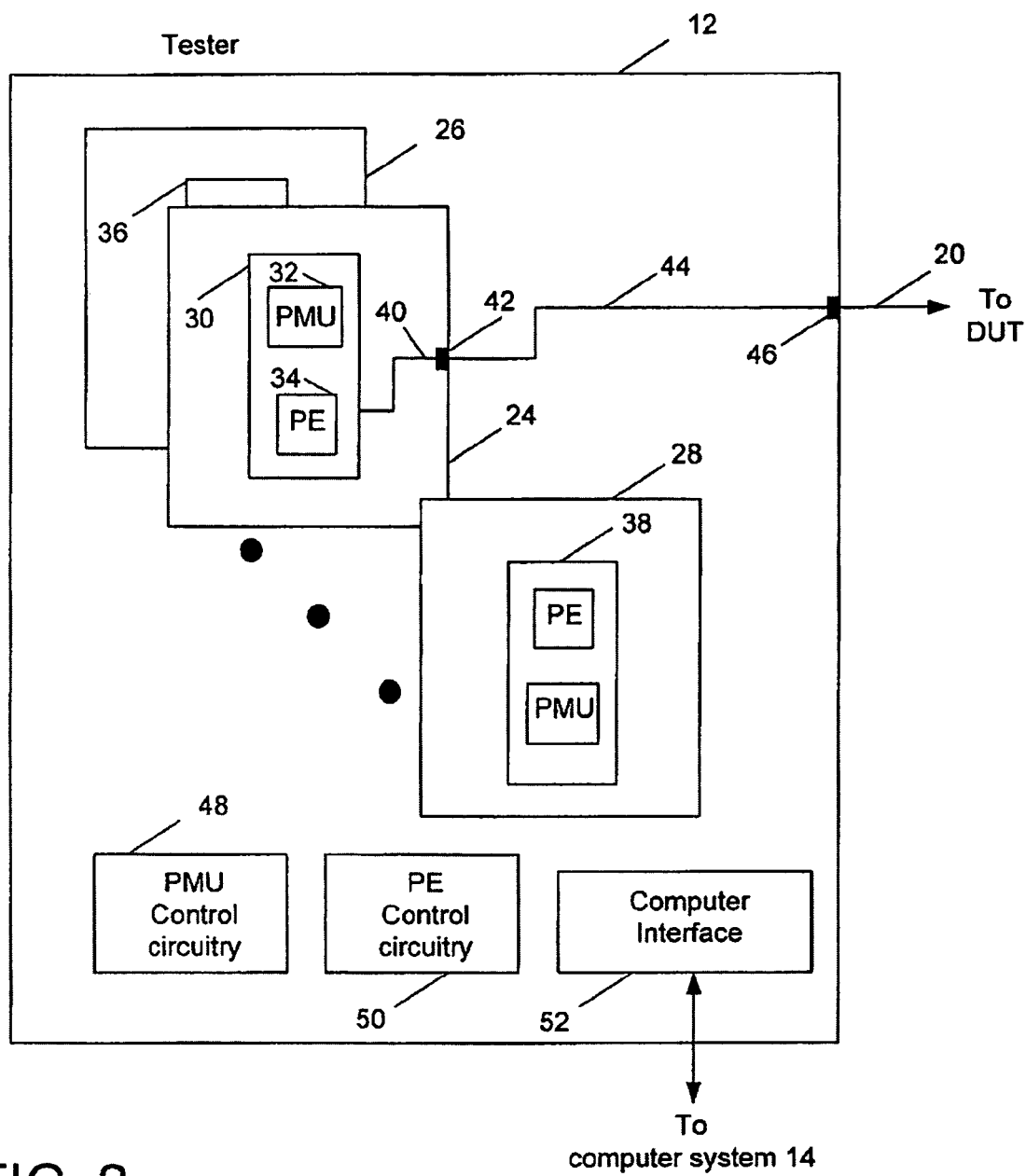
FIG. 2 is a block diagram of a tester used in the ATE.

Referring also to FIG. 2, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect corresponding responses. Each communication link to a pin is typically referred to as a channel and, by providing test signals to a large number of channels, testing time is reduced since multiple tests may be performed simultaneously. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and pin electronics (PE) tests. IC chip 30 has a PMU stage 32 that includes circuitry for performing PMU tests and a PE stage 34 that includes circuitry for performing PE tests. Additionally, interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals, or waveforms, to a DUT (e.g., DUT 18) and collecting responses to further characterize the performance of the DUT. For example, IC chip 30 may transmit (to the DUT) AC test signals that represent a vector of binary values for storage on the DUT. Once these binary values have been stored, the DUT may be accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46, which allows signals to be passed to and from tester 12. In this example, conductor 20 is connected to interface connector 46 for bidirectional signal passage between tester 12 and pin 22 of DUT 18. In some arrangements, an interface device may be used to connect one or more conductors from tester 12 to the DUT. For example, the DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example, only conducting trace 40 and conductor 44 respectively connect IC chip 30 and interface board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. The PMU control circuitry and PE control circuitry may be implemented using one or more processing devices. Examples of processing devices include, but are not limited to, a microprocessor, a microcontroller, programmable logic (e.g., a field-programmable gate array), and/or combination(s) thereof. Tester 12 also includes a computer interface 52 that allows computer system 14 to control the operations executed by tester 12 and also allows data (e.g., test parameters, DUT responses, etc.) to pass between tester 12 and computer system 14.

Figure 3:
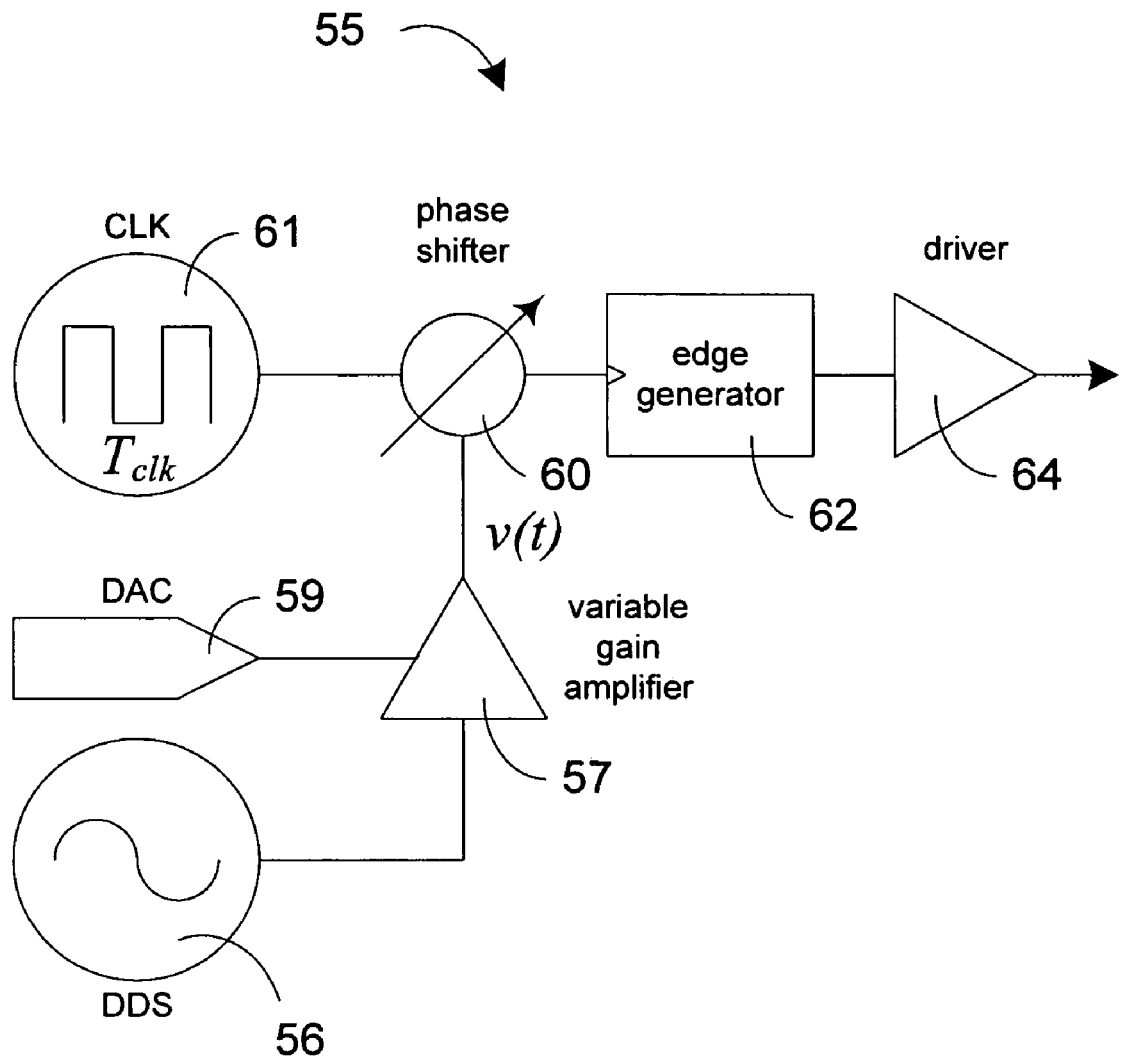
FIG. 3 is a block diagram of a jitter insertion circuit used in the tester.

FIG. 3 shows a representative jitter insertion circuit 55. Jitter insertion circuit 55 may be part of a PE stage of the ATE. Jitter insertion circuit 55 is configured to add periodic jitter (hereinafter, simply "jitter") to a test signal during DUT testing. The ATE (in the implementation described herein, system 10) determines whether the DUT can tolerate the jitter, and reports test results back, e.g., to a user. Jitter insertion circuit 55 may be controlled by one or more on- or off-ATE processing devices.

In this implementation, jitter insertion circuit 55 includes, but is not limited to, a direct digital synthesizer (DDS) 56, a variable gain amplifier (VGA) 57, a digital-to-analog controller (DAC) 59, a phase shifter 60, a clock generator 61, an edge generator 62, and a driver 64. Other implementations may employ different elements.

DDS 56 generates a periodic signal based on input digital data. For example, DDS 56 generates an analog sinusoidal signal having an amplitude and a period that are specified by input digital data. VGA 57 is an amplifier that alters the amplitude of the periodic signal generated by DDS 56. For example, VGA 57 may increase or decrease the amplitude of the periodic signal. DAC 59 provides control signal(s) to VGA 57. That is, DAC 59 receives input digital data (e.g., from a processing device), converts that input digital data into an analog control signal, and provides the resulting analog control signal to VGA 57. VGA 57 alters the amplitude of the periodic signal in accordance with the control signal from DAC 59. For example, if the control signal indicates that jitter is to be introduced, VGA 57 may increase the amplitude of the periodic signal in correspondence with the amount of added jitter.

The amplitude of the periodic signal, v(t), is used by phase shifter 60 to determine the amount of phase shift, i.e., jitter, to add to a test signal. To wit, clock generator 61 generates a clock signal. Phase shifter 60 adds jitter to the clock signal to produce a phase-shifted version of the clock signal. The amount of phase shift added to the clock signal is dictated by the amplitude of the periodic signal, v(t). Basically, the greater the amplitude of the periodic signal, v(t), the more that the phase of the clock signal is shifted. Edge generator 61 generates a set of test patterns (e.g., the test signal) in accordance with the phase-shifted clock signal. That is, the test signal is clocked in accordance with the phase-shifted clock signal. The amount of jitter added to the test signal corresponds to the amount of phase shift added to the clock signal. Driver 64 outputs the test signal from the ATE, as explained below. Responses to the test signal are received from the DUT, and analyzed to determine whether the DUT passed testing.

Figure 4:
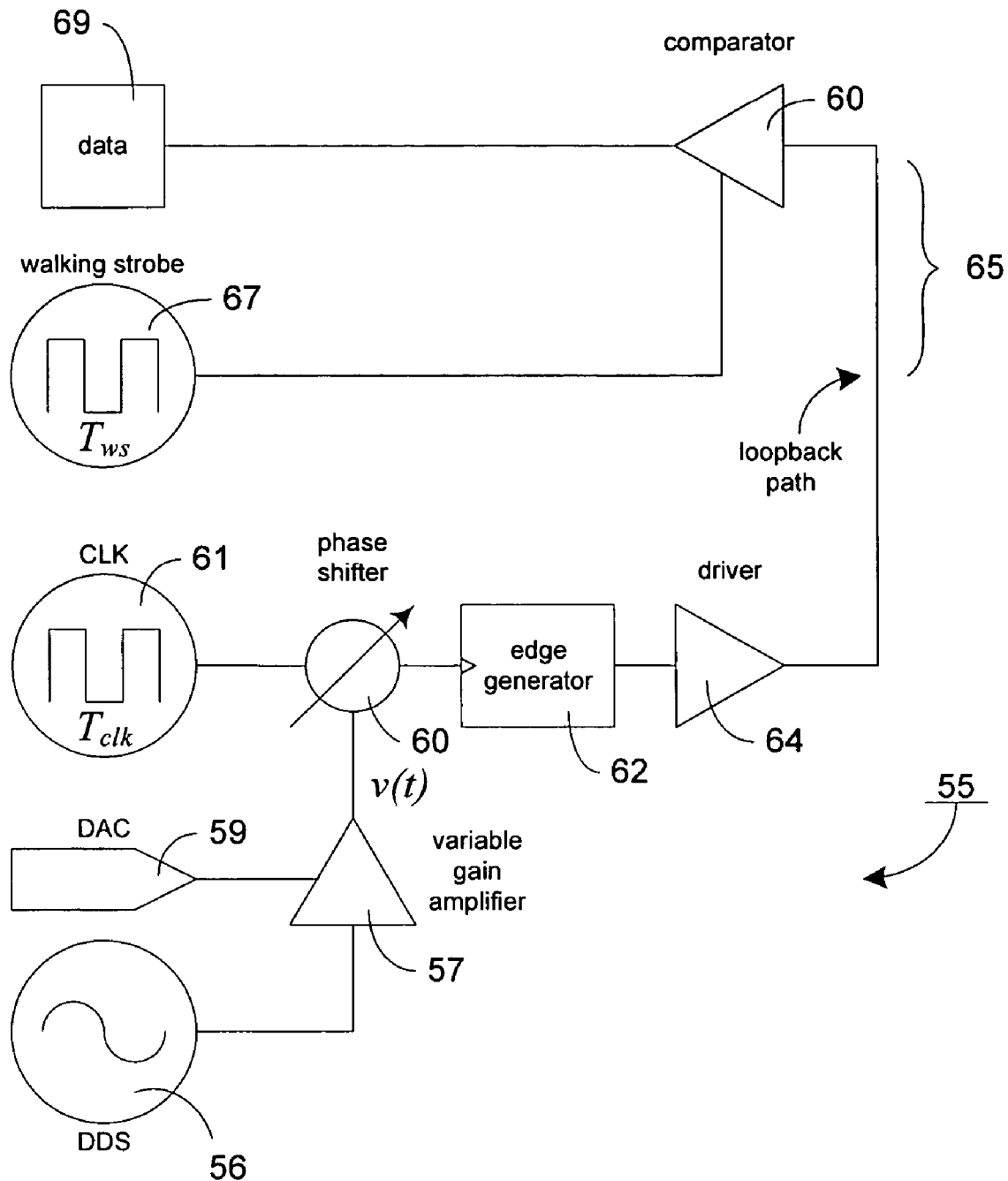
FIG. 4 is a block diagram of the jitter insertion circuit, which also includes a loopback path for use in calibrating the ATE.

During calibration, the test signal is output to a loopback path 65, as shown in FIG. 4, instead of to a DUT. Loopback path 65 is used in measuring the amount of jitter in the test signal for, e.g., different combinations of DAC 59 inputs, clock generator 61 frequencies, and DDS 56 jitter frequencies. In this regard, hardware used to implement jitter insertion circuit 55 may affect the amount of jitter in the test signal, as explained in more detail below with respect to FIG. 5. Thus, the amount of jitter in the test signal may be different than the amount of jitter that is expected (the amount of jitter that is expected may be set, e.g., by setting the input to DAC 59). In loopback path 65, the test signal (or "jittered signal") is sampled using a walking strobe clock 67. The resulting samples (data) 69 are used to produce a reconstructed version of the test signal (hereinafter, "the reconstructed signal"). The processing device(s) in the ATE (system 20) determine(s) the amount of jitter in the reconstructed signal. These values correspond to amounts of jitter that may be programmed into the tester, e.g., in memory such as EPROM (erasable programmable read-only memory) on the tester or elsewhere on, or accessible to, the ATE. The values may be retrieved during DUT testing (e.g., by a processing device at the direction of a user) to program jitter insertion circuit 55 to produce a specific amount of jitter in the test signal that is substantially equal to the expected amount of jitter.

Combinations of requested jitter amplitude, clock generator 61 frequency, and DDS 56 frequency during DUT 18 testing, which are not identical to those used during calibration, can be obtained through the use of interpolation, extrapolation, or curve fitting of jitter resulting from these factors. More specifically, calibration is performed using specific conditions for the hardware. This results in programmed jitter values that correspond to these conditions. If an amount of jitter is desired, and that jitter is not already programmed into the ATE for a particular set of conditions, the jitter can be obtained by processing one or more stored jitter values using one or more of the methods indicated above. Alternatively, jitter corresponding to those conditions may be determined beforehand using such processing, and stored on the ATE for later retrieval.

Figure 5:
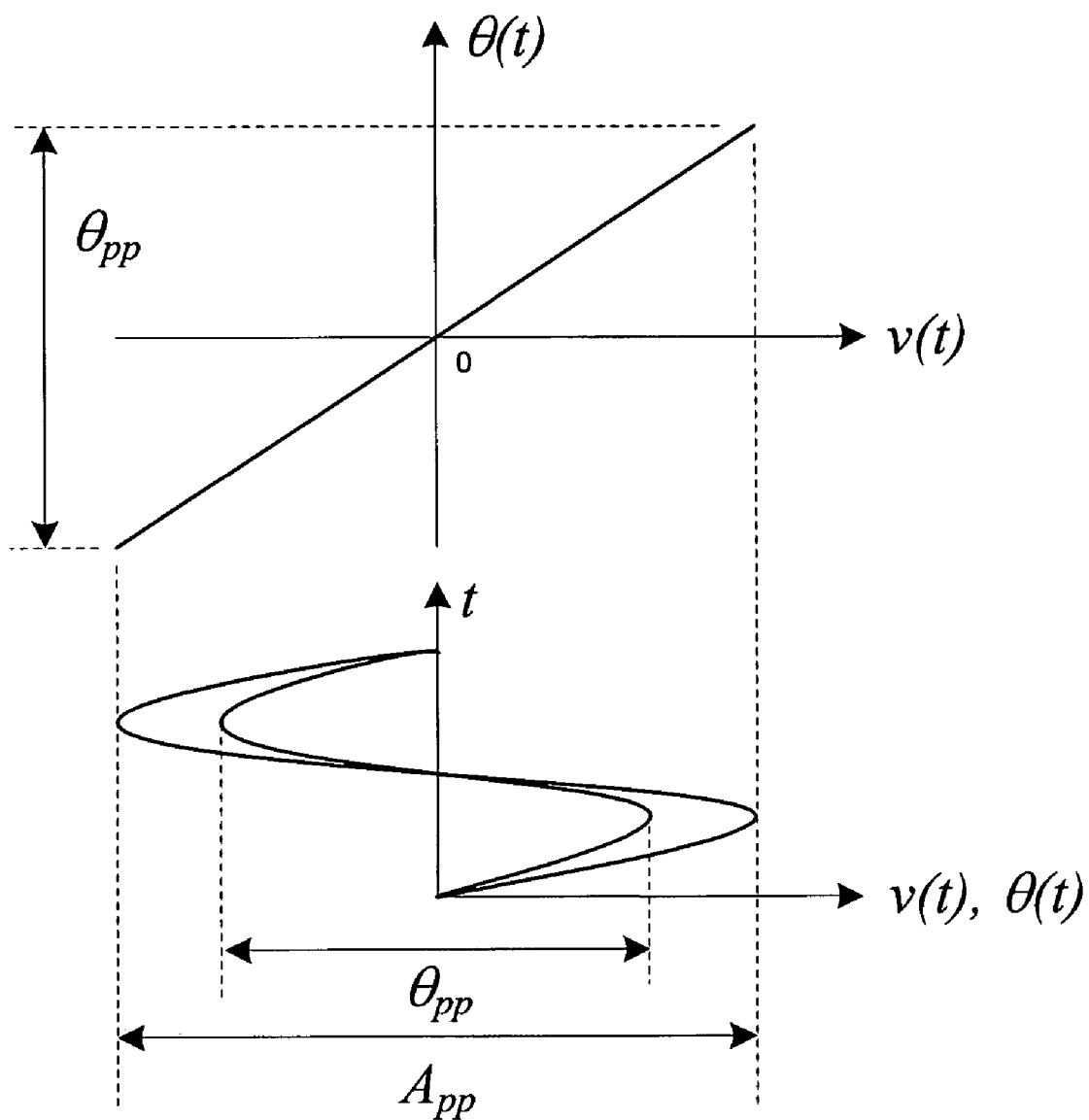
FIG. 5 shows graphs depicting, for an ideal linear phase shifter, the relationship between the phase θ(t) of a signal output by a phase generator (a phase-shifted clock signal) and a voltage v(t) input to the phase generator.

FIG. 5 is used to explain why the amount of jitter in a test signal may be different from that which is expected. FIG. 5 shows, for an ideal linear phase shifter, the relationship between the phase $\theta(t)$ of the signal output by phase shifter 60 (the phase-shifted clock signal) and the voltage $v(t)$ input to phase shifter 60. In this regard, the voltage input to phase shifter 60 is referred to herein as the "control voltage", since it is used to control phase shifter 60. The control voltage is defined as follows $$v(t) = \frac{A_{pp}}{2} \sin(2\pi f_{jtr} t),$$

where $f_{jtr}$ is the frequency of the inserted jitter (i.e., the phase modulation) in hertz (Hz) and $A_{pp}$ is the peak-to-peak amplitude of the control voltage in volts. The phase shift, in radians, of an edge of the clock signal at any time is defined as follows:

$$\theta(t) = mv(t),$$

where $$m = \frac{\theta_{pp}}{A_{pp}},$$

and $\theta_{pp}$ is the peak-to-peak phase change in radians of $\theta(t)$. If the phase shift, in radians, is mapped to jitter in units of seconds, the peak-to-peak jitter $J_{pp}$ can be expressed as $$J_{pp} = \frac{T_{clk} \theta_{pp}}{2\pi}, \text{ or}$$

$$J_{pp} = \frac{T_{clk} m A_{pp}}{2\pi}$$

where $T_{clk}$ is the period of the clock signal entering phase shifter 60. In practice, the relationship between $\theta(t)$ and $v(t)$ may not be linear, $v(t)$ may not be a perfect sine wave, and m may be a function of $T_{clk}$ and $f_{jtr}$. Thus, the actual amount of jitter inserted into a test signal may differ from that which is predicted by the above equations, namely $J_{pp}$.

The calibration process described herein is used to correct errors between the predicted or expected amount of jitter and jitter that is actually present in a test signal. The calibration process is advantageous because it uses a walking strobe clock to measure jitter in the test signal. Heretofore, jitter measurements on the test signal were performed using an oscilloscope. However, using an oscilloscope to measure jitter is time consuming and labor-intensive, at least in comparison to the walking strobe technique described herein. An example of a walking strobe clock that may be used in the calibration process is described in U.S. Pat. No. 6,609,077, the contents of which are hereby incorporated by reference into this application as if set forth herein in full. Actual operation of the walking strobe clock is described below.

Figure 7:
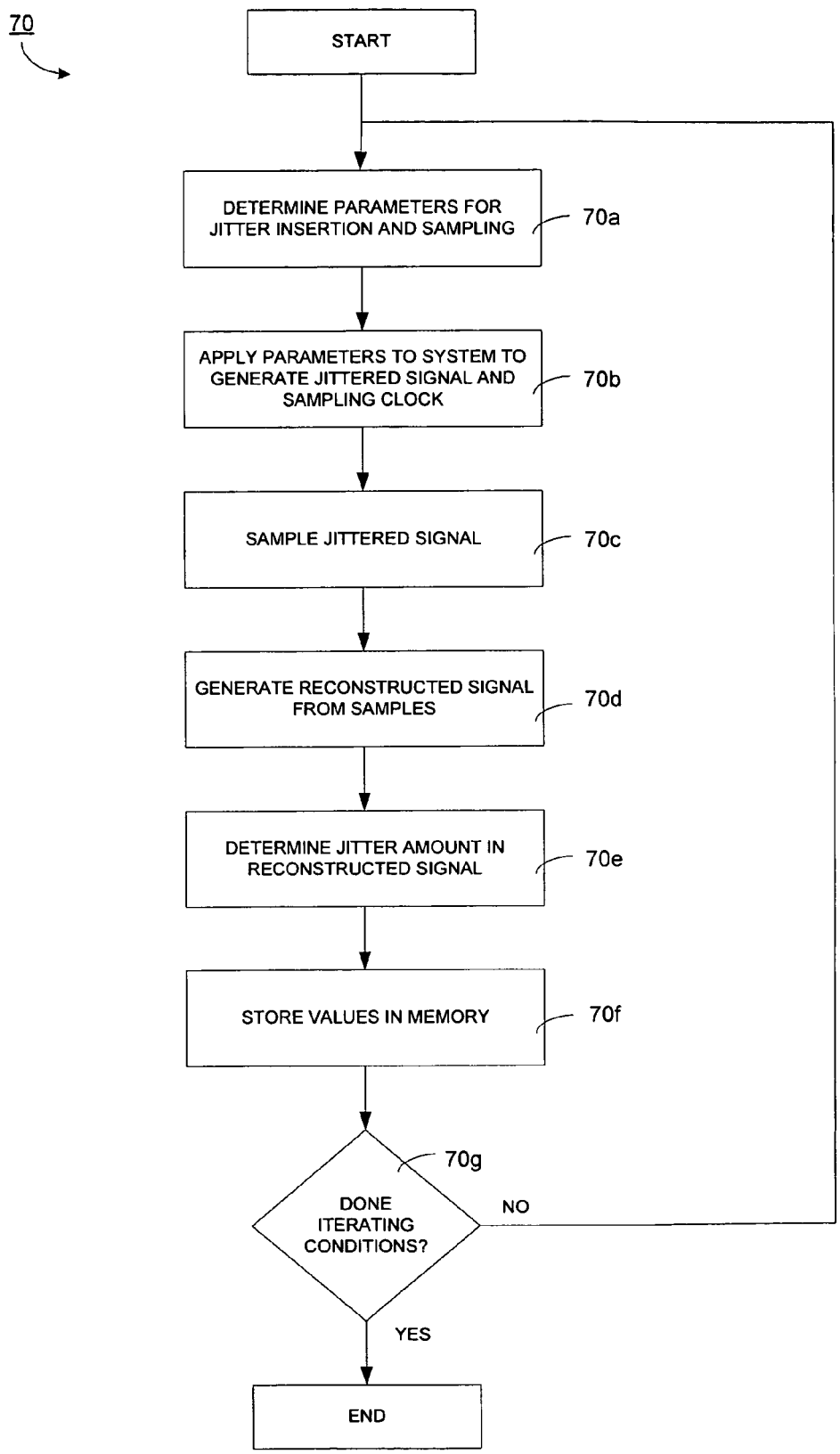
FIG. 7 is a flowchart of a process for calibrating the ATE.
Figure 8:
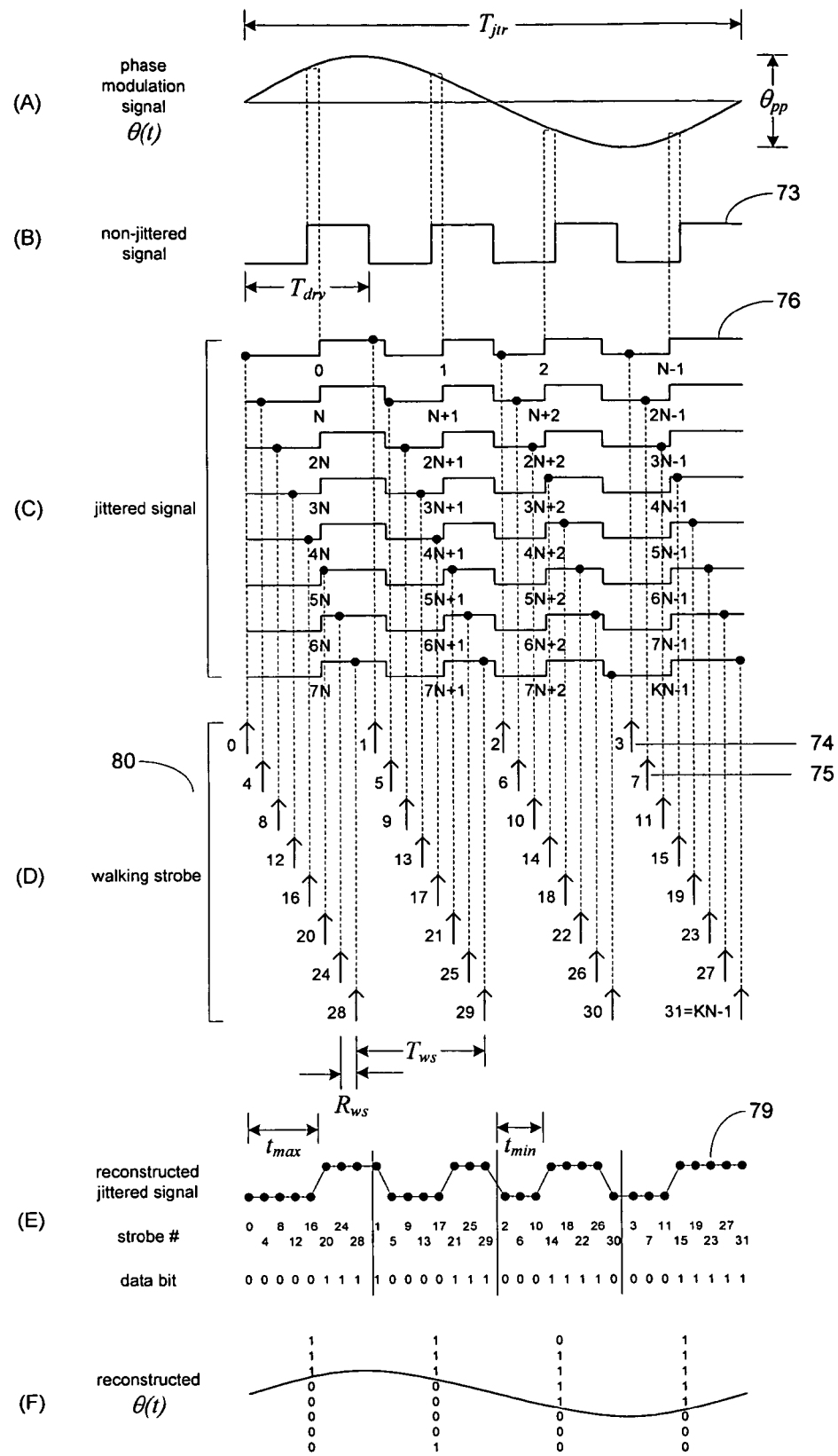
FIG. 8 shows graphs depicting a non-jittered test signal (B), a jittered test signal (C) at various points in time, walking strobe sampling points of the jittered test signal (D), a phase modulation signal used in producing the jittered test signal (A), a reconstructed test signal (E) produced from the walking strobe sampling points, and a reconstructed phase modulation signal (F) produced from the same points.

FIGS. 7 and 8 are referenced in describing a process 70, which uses the walking strobe clock in calibrating tester 12. FIG. 7 shows process 70. FIG. 8 shows an original non-jittered signal 73 (e.g., an output of edge generator 61 absent jitter), a test signal 76 (with jitter) at various points in time, a reconstructed signal 79, and points 80 at which the walking strobe clock samples test signal 76 to obtain the samples that are used to produce reconstructed signal 79.

Process 70 determines (70a), via a methods described below, the walking strobe frequency and test signal frequency for a given jitter frequency and clock generator frequency, and selects a DAC input value. Process 70 applies (70b) these settings to the jitter insertion circuit (e.g., as shown in FIG. 4) to add jitter to a test signal and thereby produce a jittered signal. One way of adding jitter to the test signal was described above with respect to FIG. 4. Referring to FIG. 4, adding jitter to a test signal involves DDS 56 generating a periodic signal, VGA 57 changing an amplitude of the periodic signal to produce an altered signal, and DAC 59 controlling VGA 57 using values that correspond to an amount of jitter. Phase shifter 60 shifts a phase of a clock signal provided by clock generator 61 by an amount that corresponds to an amplitude of the altered signal to produce a phase-shifted clock signal. Edge generator 61 uses the resulting phase-shifted clock signal to generate the test signal (with jitter), and driver 64 outputs the resulting test signal to loopback path 65.

Process 70 samples (70c) the test signal (i.e., the jittered signal) from loopback path 65, and reconstructs (70d) the test signal, at least in part, from the resulting samples (i.e., sampled zero and one values). In this implementation, comparator 66 samples the test signal in accordance with a walking strobe clock, $T_{ws}$, 67 (which may be generated using a walking strobe clock generator). The walking strobe clock has a frequency that is different from (e.g., less than) the frequency of the jittered signal, which results in sampling the test signal at a slight offset during each successive cycle 74, 75, etc., as shown in FIG. 8. In essence, the walking strobe clock is an under-sampling method. That is, comparator 66 is "strobed" at a frequency that is slightly different from that of the signal being measured, causing the walking strobe clock to progress across the signal at known offsets. In FIG. 8, during a first cycle, the walking strobe clock samples the test signal 76 at points 0, 1, 2, and 3 (80). During a next cycle, the walking strobe clock is slightly offset, resulting in sampling at points 4, 5, 6 and 7 (80), and so on. The resulting samples, i.e., the captured data bits, are used to reconstruct the test signal (with jitter) and to measure its edge positions.

Process 70 determines (70e) an amount of jitter in the reconstructed signal. Processes for determining the amount of jitter in the reconstructed signal are described below. Process 70 stores (70*f*) the determined jitter amplitude in memory that is on, or accessible to, the ATE, thereby calibrating the ATE.

Process 70 may be iterated (70*g*) for a set of calibration conditions. In other words, process 70 may be repeated to calibrate the ATE for different test conditions. These calibration conditions include, but are not limited to, clock generator 61 frequency range, DDS 56 frequency range, and DAC 59 input value range. Jitter can be added to a non-jittered signal during DUT 18 testing by processing measured jitter via interpolation, extrapolation, and/or curve fitting in order to determine DAC 59's input value for the requested jitter, clock generator frequency, and jitter frequency.

The following describes actual examples of determining jitter in accordance with process 70, which jitter may be programmed into an ATE at calibration.

Figure 6:
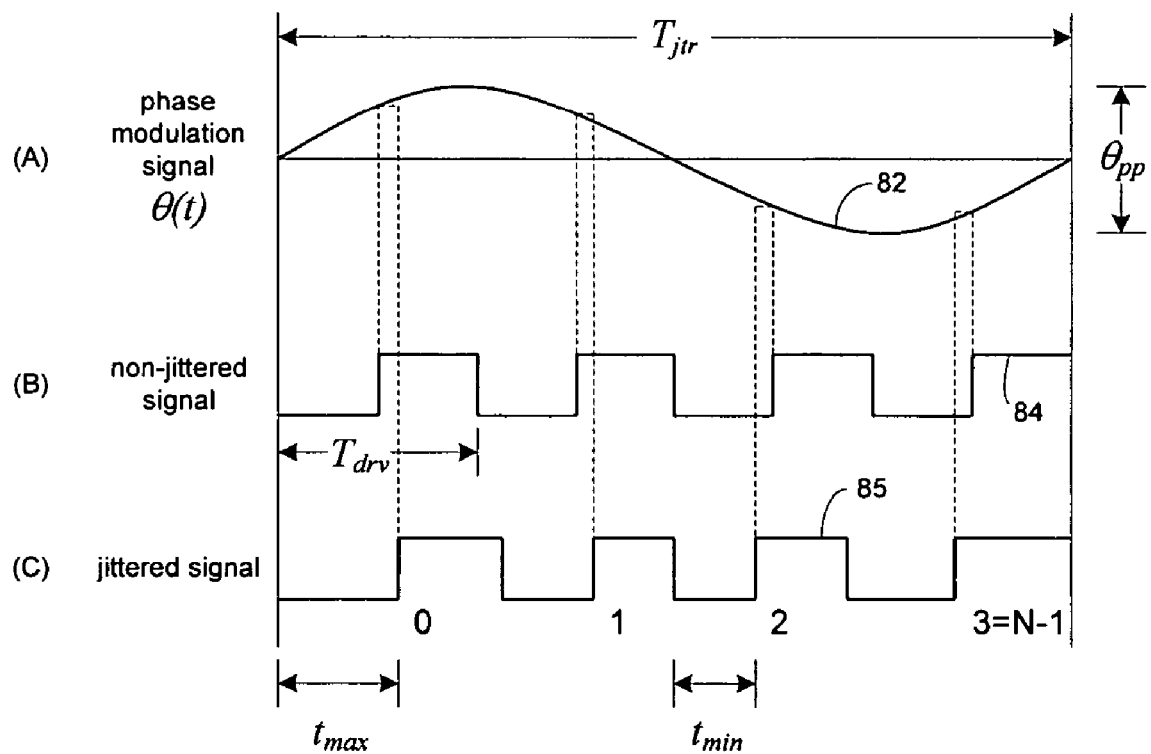
FIG. 6 shows graphs depicting a non-jittered test signal (B), a jittered test signal (C), and a phase modulation signal (A) used in producing the jittered test signal.

FIG. 6 shows a relationship between a phase modulation signal θ(t) 82, a non-jittered test signal 84, and a test signal 85 (with jitter). As noted above, θ(t) is the amount of phase shift in the jittered test signal, and is related to the periodic (e.g., sinusoidal) signal provided to phase shifter 60. The alignment between θ(t) and the non-jittered drive signal is arbitrary in that there is no required alignment. For purposes of the following explanation, $T_{jtr}$ is the jitter period, namely the phase modulation period of phase shifter 60 ($1/f_{jtr}$). $T_{drv}$ is the period ($A \cdot T_{clk}$) of the non-jittered output of edge generator 62 and A is an even positive integer. $R_{jtr}$ is the edge placement resolution in fractions of a jitter period. $t_{max}$ is the maximum edge time measured in seconds. $t_{min}$ is the minimum edge time measured in seconds.

The amount of jitter in the reconstructed signal corresponds, substantially, to a difference between a maximum edge time (e.g., $t_{max}$) and a minimum edge time ($t_{min}$) in the reconstructed jittered signal. Thus, the peak-to-peak amplitude of the jitter, in the reconstructed signal in seconds, is defined as $$J_{pp} = t_{max} - t_{min}.$$

An amount of error in $J_{pp}$ may be estimated as follows. Let $$MT_{jtr} = NT_{drv}, \text{ and}$$

$$R_{jtr} = \frac{1}{N},$$

where M and N are positive integers with no common factor other than one. The phase modulation pattern of the jittered signal edges will repeat after M jitter periods. N is the number of jittered signal rising edges at unique phase shift positions. In the example of FIG. 6, M=1 and N=4, so the phase modulation of the jittered signal edges repeats after one jitter period. The resolution of the minimum and maximum phase shift is ¼ of the jitter period. Assuming that θ(t) is a sine wave and that there is substantially perfect edge measurement accuracy, the largest measurement error ε of $J_{pp}$ as a function of $R_{jtr}$ is $$\varepsilon = J_{pp}\left[1 - \sin\left(\frac{\pi}{2} \pm \pi R_{jtr}\right)\right]$$

In accordance with the above equation, two of the rising edges of the jittered signal will hit peaks of θ(t) within a step of $\pi R_{jtr}$ radians.

Referring back to FIG. 8, assume that $T_{drv} \gg J_{pp}$. This ensures that the edges of test signal 76 can be measured without substantial ambiguity. In FIG. 8, $T_{ws}$ corresponds to the walking strobe period, and $R_{ws}$ corresponds to the reconstructed signal resolution, in seconds. $T_{ws}$ and $R_{ws}$ can be determined for the walking strobe clock such that $$T_{ws} = T_{drv} + \frac{R_{ws}}{N}, \text{ and}$$

$$\frac{T_{drv}}{R_{ws}} = K,$$

where K is a positive integer and corresponds to the number of walking strobe samples taken for a signal edge at a given point in θ(t mod $MT_{jtr}$). K is selected based on a desired edge measurement accuracy and throughput. A larger K, and thus a smaller $R_{ws}$, gives a more accurate result, but requires longer measurement execution time.

FIG. 8 also shows how the above parameters are related when M=1, N=4, and K=8. In the example of FIG. 8, there are a total of KN=32 strobes, with the rising edges of the jittered test signal in N=4 unique phase shift positions. $R_{ws}$ is ⅛ of $T_{drv}$, so the walking strobe increments by $T_{drv}/32$ relative to the beginning of a cycle for each consecutive strobe. In the graph of FIG. 8, drive cycle 0 has the same phase shift as cycles N, 2N, 3N, etc. Similarly, drive cycle 1 has the same phase shift as cycles N+1, 2N+1, 3N+1, etc. Since $T_{ws} \neq T_{drv}$, the strobe will "walk", i.e., pass over different parts of signal 76. The difference in time between the $N^{th}$ strobe and the $0^{th}$ strobe is one walking strobe resolution, $R_{ws}$ relative to the start of that cycle. The resulting sampled data is reorganized to reconstruct test signal 76 (with jitter) as reconstructed signal 79, as shown at the bottom (E) of FIG. 8. The position of the rising edges of reconstructed signal 79 can then be determined, as follows The rising edges in different cycles of the reconstructed signal have a different phase shift depending on their positions on θ(t mod $MT_{jtr}$). The peak to peak jitter amplitude $J_{pp}$ is the time difference between the latest edge and earliest edge, namely $t_{max} - t_{min}$. For strobes beyond the first position on θ(t mod $MT_{jtr}$), an adjustment of $$t_{adj} = \frac{(X \bmod N)}{N} R_{ws},$$

(where X is the strobe number), may be added to the edge time measurement to compensate for the walking of the strobe prior to determining $J_{pp}$.

Figure 9:
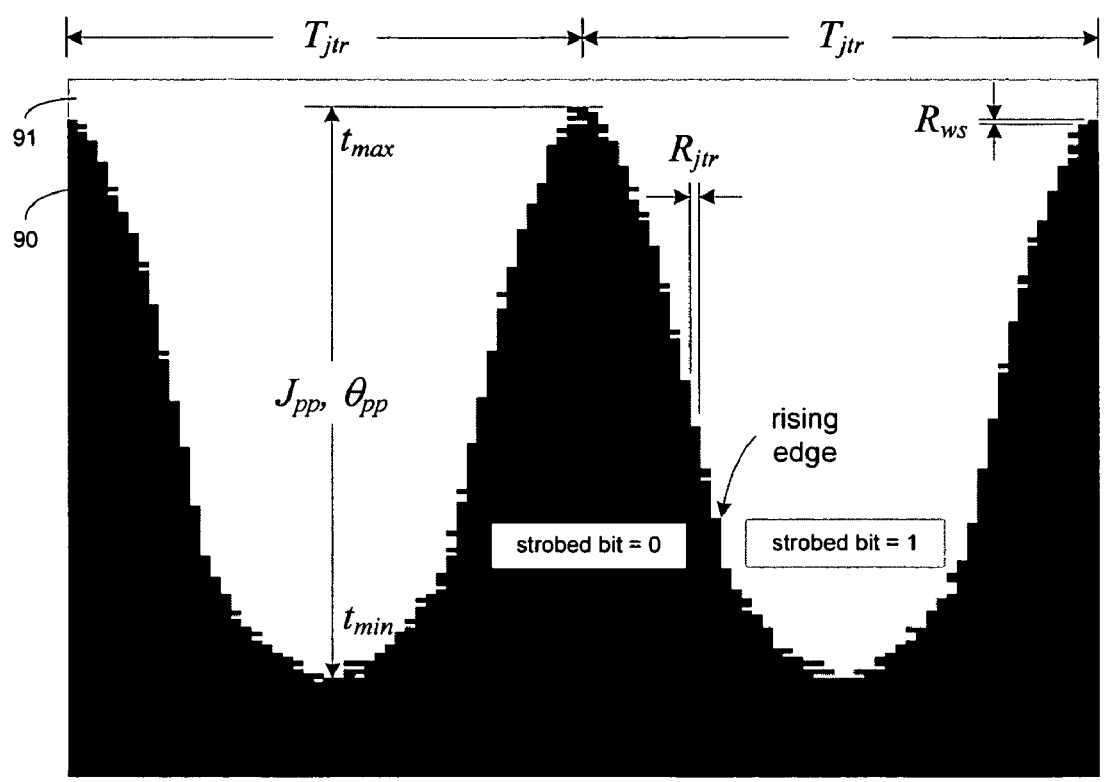
FIG. 9 shows a reproduction of the phase modulation signal from actual data.

FIG. 9 shows a reconstruction of θ(t) from an actual measurement on a physical system. In FIG. 9, dark portion 90 represents comparator 66 capturing a logic low, and light portion 91 represents comparator 66 capturing a logic high. The vertical axis, from bottom to top, shows the transition of the drive edge from low to high. Only the part of the drive waveform near the rising edge is shown; a full data set would have the vertical axis span $T_{drv}$. Each column in the plot of FIG. 9 is an edge measured on θ(t). The parameters that produced the results of FIG. 9 are M=2, N=101, $T_{drv}$=10.125 ns, K=10125, $T_{jtr}$=511.3125 ns, $T_{ws}$=10.12500990099 ns (rounded), $R_{jtr}$=1/101, $R_{ws}$=1 ps, DAC input=45612, and $J_{pp}$=133.8 ps, where ps refers to picoseconds and ns to nanoseconds. The plot of FIG. 9 shows several instances where the reconstructed edge does not have a clean transition from low to high due to random noise. The random noise can be filtered out during data processing to improve accuracy.

Process 70, and its various modifications and related processes described herein (hereinafter "the processes"), are not limited to the hardware and software described above. The processes can be implemented, at least in part, via a computer program product, i.e., a computer program tangibly embodied in an information carrier, such as one or more machine-readable media or a propagated signal, for execution by, or to control the operation of, one or more data processing apparatus, e.g., a programmable processor, a computer, multiple computers, and/or programmable logic elements.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing the processes can be performed by one or more programmable processors executing one or more computer programs to perform the functions of the calibration process. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Elements of different embodiments described herein may be combined to form other embodiments not specifically set forth above. Other embodiments not specifically described herein are also within the scope of the following claims.

What is claimed is:

1. A method of calibrating automatic test equipment(ATE), comprising:
   adding jitter to a test signal to produce a jittered signal;
   sampling the jittered signal to produce digital values, wherein sampling is performed using an under-sampling technique that samples the jittered signal in multiple cycles, and wherein, in a current sampling cycle, sampling is performed at substantially regular offsets relative to sampling performed in a previous sampling cycle such that different parts of the jittered signal are sampled in different cycles;
   generating a reconstructed jittered signal from the digital values;
   determining an amount of jitter in the reconstructed jittered signal, wherein determining the amount of jitter in the reconstructed signal comprises obtaining a difference between a maximum edge time and minimum edge time in the reconstructed jittered signal;
   wherein the amount of jitter in the reconstructed jittered signal includes jitter introduced by two or more hardware elements;
   wherein an amount of jitter added to produce the jittered signal is predicted and an amount of jitter introduced by the two or more hardware elements is unexpected; and
   calibrating the ATE based on the amount of jitter in the reconstructed jittered signal.

2. The method of claim 1, wherein the jitter is sampled using a walking strobe clock.

3. The method of claim 1, wherein adding jitter to the test signal comprises:
   generating a periodic waveform;
   changing an amplitude of the periodic waveform to produce an altered waveform;
   controlling a phase shifter using the altered waveform;
   applying a clock signal to the phase shifter to produce a phase-shifted signal; and
   using the phase-shifted signal to generate the jittered signal;
   wherein the phase shifter shifts a phase of the clock signal by an amount that corresponds to an amplitude of the altered waveform.

4. The method of claim 3, wherein the method comprises using a clock generator to apply the clock signal and using an output of a digital-to-analog controller (DAC) to change the amplitude of the periodic waveform; and
   wherein the method further comprises:
      obtaining an amount of jitter in reconstructed jittered signals for combinations of a DAC input value, clock generator frequency, and jitter frequency;
      wherein calibrating is based, at least in part, on resulting measurements of the amount of jitter in the reconstructed jittered signals for the combinations.

5. The method of claim 4, wherein calibrating comprises using at least one of interpolation, extrapolation, and curve fitting to obtain amounts of jitter.

6. The method of claim 5, wherein calibrating comprises storing, on the ATE, data corresponding to obtained amounts of jitter for the combinations of DAC input value, clock generator frequency, and jitter frequency, the data being usable to obtain a specified amount of jitter during testing of a device using the ATE.

7. Automatic test equipment (ATE) comprising:
   circuitry to add jitter to a test signal to produce a jittered signal;
   a clock generator to produce a clock signal;
   a comparator to sample the jittered signal in accordance with the clock signal, and, as a result of sampling, to output digital values, wherein sampling is performed using an under-sampling technique that samples the jittered signal in multiple cycles, and wherein, in a current sampling cycle, sampling is performed at substantially regular offsets relative to a previous sampling cycle such that different parts of the jittered signal are sampled in different cycles; and
   one or more processing devices to generate a reconstructed jittered signal from the digital values, to determine an amount of jitter in the reconstructed jittered signal, and to calibrate the ATE based on the amount of jitter in the reconstructed jittered signal;
   wherein determining the amount of jitter in the reconstructed signal comprises obtaining a difference between a maximum edge time and minimum edge time in the reconstructed jittered signal;
   wherein the amount of jitter in the reconstructed jittered signal includes jitter introduced by two or more hardware elements; and
   wherein an amount of jitter added to produce the jittered signal is predicted and an amount of jitter introduced by the two or more hardware elements is unexpected.

8. The ATE of claim 7, wherein the clock generator is configured to generate a walking strobe clock, the walking strobe clock having a frequency that is used for sampling.

9. The ATE of claim 7, wherein the circuitry comprises:
a direct digital synthesizer to generate a periodic waveform;
a digital-to-analog controller (DAC) to provide data for controlling an amplitude of the periodic waveform;
a variable gain amplifier to control the amplitude of the periodic waveform in accordance with the data to produce an altered waveform;
a phase shifter that is controllable using the altered waveform;
a signal generator to apply a clock signal to the phase shifter to produce a phase-shifted signal; and
an edge generator to produce the jittered signal based on the phase-shifted signal;
wherein the phase shifter is configured to shift a phase of the clock signal by an amount that corresponds to an amplitude of the altered waveform.

10. The ATE of claim 8, further comprising memory to store data corresponding to an amount of jitter added to the test signal, the data being usable to obtain a requested amount of jitter during testing of a device using the ATE.

11. The ATE of claim 9, wherein calibrating the ATE comprises:
obtaining an amount of jitter in reconstructed jittered signals for different combinations of a DAC input value, signal generator frequency, and jitter frequency.

12. The ATE of claim 11, wherein the one or more processing devices are configured to determine the DAC input value and using at least one of interpolation, extrapolation, and curve fitting to obtain jitter amounts from the reconstructed jittered signals.

13. One or more machine-readable media comprising instructions that are executable by one or more processing devices to calibrate automatic test equipment (ATE), the instructions for causing the one or more processing devices to:
generate a reconstructed jittered signal from digital values that were sampled from a jittered signal using a clock signal, the jittered signal. comprising a test signal to which an amount of jitter has been added;
wherein the digital values were sampled using an under-sampling technique that samples the jittered signal in multiple cycles, and wherein, in a current sampling cycle, sampling is performed at substantially regular offsets relative to a previous sampling cycle such that different parts of the jittered signal are sampled in different cycles;
determine an amount of jitter in the reconstructed jittered signal wherein determining the amount of jitter in the reconstructed signal comprises obtaining a difference between a maximum edge time and minimum edge time in the reconstructed jittered signal;
wherein the amount of jitter in the reconstructed jittered signal includes jitter introduced by two or more hardware elements;
wherein an amount of jitter added t produce the jittered signal is predicted and an amount of jitter introduced by the two or more hardware elements is unexpected; and
calibrate the ATE based on the amount of jitter in the reconstructed jittered signal.

14. The one or more machine-readable media of claim 13, wherein the jitter is sampled using a walking strobe clock; and
wherein the one or more machine-readable media further comprises instructions that are executable to cause the one or more processing devices to store, on the ATE, data corresponding to an amount of jitter added to the test signal, the data being usable to obtain a predefined amount of jitter during testing of a device using the ATE.

15. The one or more machine-readable media of claim 14, wherein calibrating the ATE comprises calibrating the ATE for one or more different combinations of conditions that produce jitter.

16. Circuitry comprising:
a phase shifter to add jitter to a test signal to produce a jittered signal;
a circuit to sample the jittered signal using a walking strobe clock to thereby produce digital values, corresponding to jitter introduced into the jittered signal;
wherein sampling is performed using an wider-sampling technique that samples the jittered signal in multiple cycles, and wherein, in a current sampling cycle, sampling is performed at substantially regular offsets relative to a previous sampling cycle such that different parts of the jittered signal are sampled in different cycles; and
one or more processing devices to store, in memory on a testing device, data indicative of an amount of jitter to be added to an output signal to produce a desired amount of jitter in the output signal, wherein the data is based on the digital values;
wherein the data indicative of an amount of jitter is determined based on a difference between a maximum edge time and minimum edge time in a reconstructed jittered signal;
wherein the amount of jitter in the reconstructed jittered signal includes jitter introduced by two or more hardware elements; and
wherein an amount of jitter added to produce the jittered signal is predicted and an amount of jitter introduced by the two or more hardware elements is unexpected.

17. The circuitry of claim 16, further comprising a clock generator to generate the walking strobe clock, the walking strobe clock having a frequency that is used for sampling.

18. A method of calibrating automatic test equipment (ATE), comprising:
adding jitter to a test signal to produce a jittered signal;
sampling the jittered signal to produce digital values;
generating a reconstructed jittered signal from the digital values;
determining an amount of jitter in the reconstructed jittered signal; and
calibrating the ATE based on the amount of jitter in the reconstructed jittered signal wherein adding jitter to the test signal comprises:
generating a periodic waveform;
changing an amplitude of the periodic waveform to produce an altered waveform;
controlling a phase shifter using the altered waveform;
applying a clock signal to the phase shifter to produce a phase-shifted signal; and
using the phase-shifted signal to generate the jittered signal;
wherein the phase shifter shifts a phase of the clock signal by an amount that corresponds to an amplitude of the altered waveform;
wherein the method further comprises:
using a clock generator to apply the clock signal and using an output of a digital-to-analog controller (DAC) to change the amplitude of the periodic waveform;
obtaining amounts of jitter in reconstructed jittered signals for combinations of a DAC input value, clock generator frequency, and jitter frequency; and wherein calibrating is based, at least in part, on resulting measurements of the amount of jitter in the reconstructed jittered signals for the combinations.

19. The method of claim 18, wherein calibrating comprises using at least one of interpolation, extrapolation, and curve fitting to obtain amounts of jitter.

20. The method of claim 18, wherein the jitter is sampled using a walking strobe clock, the walking strobe clock having a frequency that is different from a frequency of the jittered signal.

21. The method of claim 19, wherein calibrating comprises storing, on the ATE, data corresponding to obtained amounts of jitter for the combinations of DAC input value, clock generator frequency, and jitter frequency, the data being usable to obtain a specified amount of jitter during testing of a device using the ATE.

22. Automatic test equipment (ATE) comprising:
   circuitry to add jitter to a test signal to produce a jittered signal;
   a clock generator to produce a clock signal;
   a comparator to sample the jittered signal in accordance with the clock signal, and, as a result of sampling, to output digital values; and
   one or more processing devices to generate a reconstructed jittered signal from the digital values, to determine an amount of jitter in the reconstructed jittered signal, and to calibrate the ATE based on the amount of jitter in the reconstructed jittered signal;
   wherein the circuitry comprises:
     a direct digital synthesizer to generate a periodic waveform;
     a digital-to-analog controller (DAC) to provide data for controlling an amplitude of the periodic waveform;
     a variable gain amplifier to control the amplitude of the periodic waveform in accordance with the data to produce an altered waveform;
     a phase shifter that is controllable using the altered waveform;
     a signal generator to apply a clock signal to the phase shifter to produce a phase-shifted signal; and
     an edge generator to produce the jittered signal based on the phase-shifted signal;
   wherein the phase shifter is configured to shift a phase of the clock signal by an amount that corresponds to an amplitude of the altered waveform.

23. The ATE of claim 22, wherein calibrating the ATE comprises:
   obtaining an amount of jitter in reconstructed jittered signals for different combinations of a DAC input value, signal generator frequency, and jitter frequency.

24. The ATE of claim 22, wherein the clock generator is configured to generate a walking strobe clock, the walking strobe clock having a frequency that is different from a frequency of the jittered signal.

25. The ATE of claim 23, wherein the one or more processing devices are configured to determine the DAC input value and using at least one of interpolation, extrapolation, and curve fitting to obtain jitter amounts from the reconstructed jittered signals.

* * * * *